United States Patent [19]

Beaumont et al.

[11] Patent Number: 6,003,757

[45] Date of Patent: Dec. 21, 1999

[54] APPARATUS FOR TRANSFERRING SOLDER BUMPS AND METHOD OF USING

[75] Inventors: Guy Daniel Beaumont; Guy Paul Brouillette; David Hirsch Danovitch, all of Quebec, Canada; Peter Alfred Gruber, Mohegan Lake, N.Y.

[73] Assignee: International Business Machines Corporation, Armonk, N.Y.

[21] Appl. No.: 09/070,120

[22] Filed: Apr. 30, 1998

[51] Int. Cl.[6] .............................. B23K 3/00; B23K 31/02
[52] U.S. Cl. ........................... 228/246; 228/41; 228/44.7
[58] Field of Search ........................... 228/41, 44.7, 245, 228/246

[56] References Cited

U.S. PATENT DOCUMENTS

| | | | |
|---|---|---|---|
| 5,201,451 | 4/1993 | Desai et al. | 228/44.7 |
| 5,632,437 | 5/1997 | Vongfuangfoo et al. | 228/212 |
| 5,816,482 | 10/1998 | Grabbe | 228/212 |

Primary Examiner—Patrick Ryan
Assistant Examiner—Jeffrey T. Knapp
Attorney, Agent, or Firm—Robert M. Trepp; Randy W. Tung

[57] ABSTRACT

An apparatus and a method for transferring solder bumps from a solder mold to a solder-receiving substrate are disclosed. The apparatus includes a transfer fixture constructed by a base member, a lid member and a compressible member for holding a mold/substrate assembly therein. A plurality of compression pins are mounted through the lid member for supplying a uniform pressure on the mold/substrate assembly and for allowing lateral motion of the mold/substrate assembly relative to the transfer fixture due to a mismatch in the coefficients of thermal expansion. The compressible member is a cellulosic foam sheet which applies a uniform joining force across the entire surface of a wafer and assures abutting contact between the entire wafer and the mold surface. The foam sheet further assists in the lateral movement of the mold/substrate assembly relative to the base member of the transfer fixture.

41 Claims, 3 Drawing Sheets

APPARATUS FOR TRANSFERRING SOLDER BUMPS AND METHOD OF USING

FIELD OF THE INVENTION

The present invention generally relates to a method and apparatus for transferring solder bumps from a solder mold to a solder-receiving substrate and more particularly, relates to a method and apparatus for transferring solder bumps from a solder mold to a solder-receiving substrate by using a unique transfer fixture that allows independent movement of a mold/substrate assembly against a base member and a lid member of the transfer fixture in which the assembly is held to compensate for differences in coefficients of thermal expansion during a subsequent thermal cycle.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. The formation of the solder balls is normally carried out by an evaporation method of lead and tin through a mask for producing the desired solder balls. More recently, the technique of electro-deposition has been used to produce solder balls in flip-chip packaging.

Other solder ball formation techniques that are capable of solder-bumping a variety of substrates have also been proposed. These techniques work fairly well in bumping semiconductor substrates that contain solder structures over a minimum size. One of the more popularly used techniques is a solder paste screening technique which can be used to cover the entire area of an 8 inch wafer. However, with the recent trend in the miniaturization of device dimensions and the reduction in bump-to-bump spacing (or pitch), the solder paste screening technique becomes impractical. For instance, one of the problems in applying solder paste screening technique to modem IC devices is the paste composition itself. A paste is generally composed of a flux and solder alloy particles. The consistency and uniformity of the solder paste composition become more difficult to control with a decreasing solder bump volume. A possible solution for this problem is the utilization of solder pastes that contain extremely small and uniform solder particles. However, this can only be done at a high cost penalty. Another problem in using the solder paste screening technique in modern high density devices is the reduced pitch between bumps. Since there is a large reduction in volume from a screened paste to the resulting solder bump, the screen holes must be significantly larger in diameter than the final bumps. The stringent dimensional control of the bumps makes the solder paste screening technique impractical for applications in high density devices.

Another concern with the solder paste screening technique is that the solder paste is normally applied directly to substrates through a screen mask which contains holes aligned to the paste-receiving pads on the substrate. The substrate may be a silicon wafer or a substrate of any other material. Since the paste is applied directly by the screening method, any problems occurring during the process result in rework of the substrate.

A more recently developed injection molded solder (IMS) technique attempted to solve these problems by dispensing molten solder instead of solder paste. However, problems have been observed when the technique is implemented to wafer-sized substrates. U.S. Pat. No. 5,244,143, assigned to the common assignee of the present invention, discloses the injection molded solder technique and is hereby incorporated by reference in its entirety. One of the advantages of the IMS technique is that there is very little volume change between the molten solder and the resulting solder bump. The IMS technique teaches the use of a two inch wide head that fills boro-silicate glass molds that are wide enough to cover most single chip modules. A narrow wiper provided behind the solder slot passes the filled holes once to remove excess solder.

The IMS method for solder bonding can be carried out by typically applying a molten solder to a substrate in a transfer process. When smaller substrates, i.e., chip scale or single chip modules (SCM's) are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped. Over a small area, flux material which is dispensed in a thin layer over the chip prior to being joined to a solder-filled IMS mold keeps both surfaces in intimate contact due to surface tension of the liquid flux. This is desirable such that when solder in the mold balls-up upon heating to a melting temperature in a furnace, it contacts the solder-receiving pad which is normally covered with gold or other solder-wetting alloy.

Another method that does not have the limitations of the solder paste screening technique of significant volume reductions between the initial paste and the final solder volume is the molten solder screening (MSS) method. In the MSS method, pure molten solder is dispensed. When the MSS solder-bumping method is used on large substrates such as 8 inch or 12 inch wafers, surface tension alone is insufficient to maintain intimate contact between a mold and a substrate. In order to facilitate the required abutting contact over large surface areas, a new method and apparatus for maintaining such are therefore necessary.

It is therefore an object of the present invention to provide an apparatus for transferring solder bumps from a mold to a substrate that does not have the drawbacks and shortcomings of a conventional apparatus.

It is another object of the present invention to provide an apparatus for transferring solder bumps from a mold to a substrate that is constructed by a base member, a compressible member and a lid member.

It is a further object of the present invention to provide an apparatus for transferring solder bumps from a solder mold to a solder-receiving substrate by utilizing a transfer fixture which is capable of applying uniform pressure on a mold/substrate assembly during the transfer process.

It is another further object of the present invention to provide an apparatus for transferring solder bumps from a solder mold to a solder-receiving substrate which includes a transfer fixture for applying an uniform pressure on a mold/substrate assembly and allowing lateral movement of the assembly relative to the fixture due to differences in the coefficients of thermal expansion of the various components.

It is still another object of the present invention to provide an apparatus for transferring solder bumps from a solder mold to a solder-receiving substrate which includes a solder mold constructed of a substantially transparent material so that the mold cavities contained therein can be readily examined.

It is yet another object of the present invention to provide an apparatus for transferring solder bumps from a solder mold to a solder-receiving substrate which includes a lid member having a skeletal configuration such that the mold/substrate assembly can be visually inspected with the lid member mounted on the assembly.

It is still another further object of the present invention to provide an apparatus for transferring solder bumps from a solder mold to a solder-receiving substrate by using a lid member equipped with a plurality of compression pins having contact points for applying a substantially uniform pressure on a mold/substrate assembly while allowing lateral movement of the assembly due to mismatched coefficients of thermal expansion of the various components during a thermal cycle.

It is yet another further object of the present invention to provide an apparatus for transferring solder bumps from a solder mold to a solder-receiving substrate which includes a cellulosic foam member positioned between a mold/substrate assembly and a base member for allowing lateral movement of the assembly relative to the base member due to differences in the coefficients of thermal expansion.

SUMMARY OF THE INVENTION

In accordance with the present invention, a method and apparatus for transferring solder bumps from a mold to a substrate is provided.

In a preferred embodiment, an apparatus for transferring solder bumps from a mold to a substrate is provided which includes a base member adapted for receiving a mold/substrate assembly therein, a compressible member adapted for placement between the base member and the mold/substrate assembly, and a lid member adapted for engaging the base member in such a way that a substantially uniform pressure is applied on top of the mold/substrate assembly. The lid member in the apparatus may further include a plurality of compression pins adapted for applying the substantially uniform pressure on top of the mold/substrate assembly. Each of the plurality of compression pins is equipped with a point contact for contacting a top surface of the mold/substrate assembly. Each of the plurality of the compression pins may be independently adjusted toward or away from the mold/substrate assembly. The plurality of compression pins further enable the lid member to mechanically decouple from the mold/substrate assembly so as to allow independent movement of the lid member relative to the assembly to accommodate mismatch in coefficients of thermal expansion during a subsequent thermal cycle. The base member may further include a base plate and two side plates each joined to the base plate at an opposite end. The lid member is pivotally connected to the base member in a clam-shell construction. The lid member has a skeletal structure such that the mold/substrate assembly is substantially exposed. The skeletal structure may be a H-frame such that the mold/substrate assembly under the lid member can be visually examined.

The compressible member has a cellulosic structure which can be compressed to apply a uniform joining force across the entire surface of a wafer and assures abutting contact between the entire wafer and the mold surface. The compressible member is a foam material that can survive a temperature exposure up to 400° C. The mold/substrate assembly may include a solder mold and a solder-receiving substrate intimately joined together. The solder mold is constructed of a material that is substantially transparent, such as glass. The solder mold and the solder-receiving substrate normally have substantially the same coefficient of thermal expansion. The plurality of compression pins may be five pins that are positioned spaced apart through the lid member for applying a substantially uniform pressure on top of the mold/substrate assembly. The compressible member further enables the base member to mechanically decouple from the mold/substrate assembly so as to allow independent movement of the base member against the mold/substrate assembly to accommodate mismatch in coefficient of thermal expansion during a subsequent thermal cycle.

In another preferred embodiment, an apparatus for transferring solder bumps from a solder mold to a solder-receiving substrate is provided which includes a transfer fixture comprises a lid member and a base member, a mold/substrate assembly comprises a solder mold and solder-receiving substrate intimately joined together and positioned in the transfer fixture, first means for applying pressure on the mold/substrate assembly in allowing lateral motion between the lid member and the mold/substrate assembly, and second means for applying pressure on the mold/substrate assembly and allowing lateral motion between the base member and the mold/substrate assembly.

The first means for applying pressure and allowing lateral motion between the lid member and the mold/substrate assembly includes a plurality of compression pins mounted through the lid member and adapted for applying a substantially uniform pressure on the mold/substrate assembly while allowing lateral motion between the lid member and the mold/substrate assembly. Each of the plurality of compression pins is equipped with a point contact for contacting a top surface of the mold/substrate assembly. The plurality of compression pins may be five compression pins that are spaced apart and positioned through the lid member which has a H-shaped frame structure. The second means for applying pressure on the mold/substrate assembly for allowing lateral motion between the base member and the mold/substrate assembly includes a compressible member adapted for placement between the base member and the mold/substrate assembly. The compressible member has a cellulosic structure for use at temperatures up to 400° C. The lid member is pivotally connected to the base member forming a clam-shell construction. The mold member can be constructed of a material that is substantially transparent, while the mold and the substrate have substantially the same coefficient of thermal expansion.

The present invention is further directed to a method for transferring solder bumps from a mold to a substrate including the steps of providing a base member that has a cavity formed therein, positioning a compressible member in the cavity, positioning a mold/substrate assembly on top of the compressible member, and compressing a top surface of the mold/substrate assembly by a lid member. The method may further include the step of contacting a top surface of the mold/substrate assembly with point contacts provided on the tips of a plurality of compression pins positioned in the lid member and applying a uniform pressure. The method may further include a step of providing a plurality of compression pins in the lid member and adjusting towards or away from a top surface of the mold/substrate assembly such that a uniform pressure is applied on the top surface of the assembly.

The present invention method transfers solder bumps from a solder mold to a solder-receiving substrate, i.e., a wafer. The method may further include the step of pivotally connecting a lid member to a base member to form a clam-shell construction, the step of providing a lid member that has a skeletal structure such that the mold/substrate assembly is substantially exposed, the step of aligning bond pads on the substrate with cavities in the mold prior to the compression step, the step of providing a compressible member that has a cellulosic structure, the step of providing a mold constructed of a material that is substantially transparent, and the step of providing a mold and a substrate that have substantially the same coefficient of thermal expansion.

The present invention method may further include the step of mechanically decoupling the plurality of compression pins from the mold/substrate assembly such that either the lid member or the mold/substrate assembly may move independently of the other to accommodate mismatch in coefficients of thermal expansion during a subsequent thermal cycle. The method may further include the step of mechanically decoupling the compressible member from the mold/substrate assembly such that a base member may move independently from the mold/substrate assembly for accommodating mismatch in coefficient of thermal expansion during a subsequent thermal cycle, and the step of reflowing and transferring solder in the mold to the substrate in a reflow furnace, the step of removing an empty mold from a bumped substrate.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention discloses a method and apparatus for transferring solder bumps from a solder mold to a solder-receiving substrate by utilizing a transfer fixture that is capable of applying a uniform pressure on a mold/substrate assembly while allowing lateral movement of the assembly relative to the transfer fixture caused by mismatched coefficients of thermal expansion in a subsequent thermal cycle. The uniform pressure placed on the mold/substrate assembly is accomplished by utilizing a plurality of compression pins mounted in a lid member of the transfer fixture such that only point contacts are placed on top of the assembly for allowing independent movement of the assembly in relation to the transfer fixture. The apparatus further utilizes a compressible member such as a cellulosic foam sheet positioned between a base member of the assembly and the mold/substrate assembly to assist the movement of the assembly due to thermal expansion of the various components.

Figure 1:
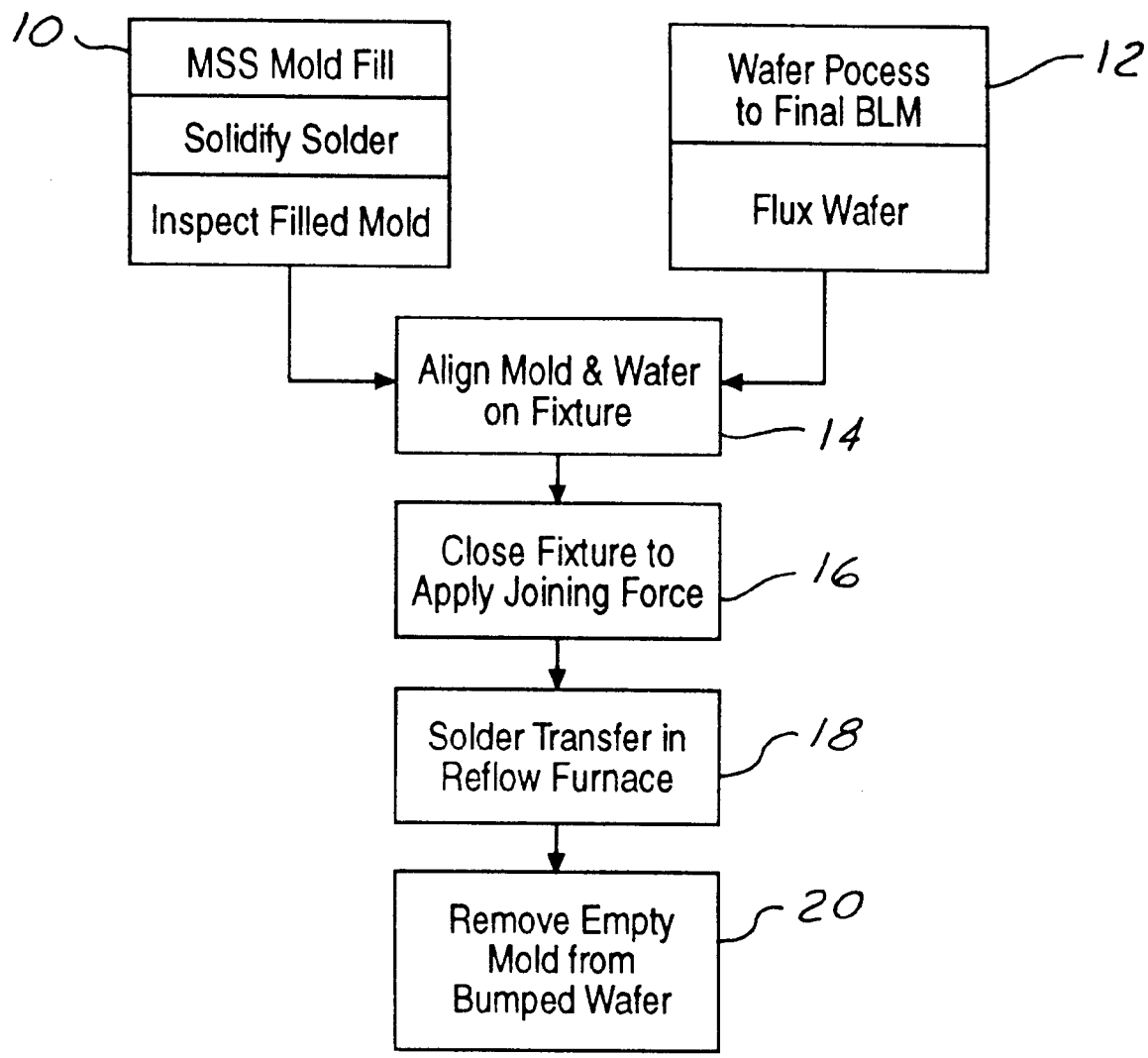
FIG. 1 is a process flow block diagram illustrating the present invention method.

Referring initially to FIG. 1, where it is shown a process flow block diagram for the present invention method. At the beginning of the process, a solder mold and a semiconductor wafer are independently prepared for use in the present invention novel method. For instance, block 10 indicates that a molten solder screening (MSS) mold is first filled such that all cavities contain a predetermined amount of molten solder. The molten solder in the cavities is then allowed to solidify at a temperature below the melting point of the solder material. The filled solder mold is then inspected to insure that all cavities are properly filled. Simultaneously, a semiconductor wafer is processed to a final stage with a ball limiting metallurgy (BLM) layer on top. This is shown in block 12. The surface of the semiconductor wafer is then coated with a flux layer. A variety of flux material may be used to suit the specific solder material selected.

The solder mold filled with solder and the fluxed wafer are then aligned and intimately mated together with the solder material in the mold facing the bond pads on thhown in block 14. A mold/substrate assembly is thus formed and then placed in a transfer fixture. A detailed description of the transfer fixture shall be given in a later section. A lid member of the transfer fixture is then closed onto a base member and fastened by mechanical means. As shown by block 16, a uniform pressure is then applied on the top surface of the mold/substrate assembly by utilizing a compressible member of cellulosic foam positioned between the base member and the mold/substrate assembly and a plurality of compression pins mounted in the lid member of the fixture. A desirable pressure can be determined by experimental means.

The lid member is constructed in a H-frame such that most of the mold/substrate assembly is exposed through the lid member of the transfer fixture to enable visual examination of the assembly. Since the mold member is made of a substantially transparent material, the proper alignment of the mold and the substrate can be reinspected after the fastening of the transfer fixture. The transfer fixture, together with the mold/substrate contained therein, is then placed in a reflow furnace which is preset at a desirable reflow temperature for the specific solder material used. This is shown in block 18. After a suitable amount of time for transferring solder bumps onto the surface of the semiconductor wafer, as shown in block 20, the transfer fixture can be taken out of the reflow furnace and allowed to cool below the reflow temperature of the solder material. After the transfer fixture is disassembled by taking the lid member off, an empty solder mold can be removed from the bumped semiconductor wafer. The transfer fixture is then ready for the next transfer process by engaging another set of mold/substrate assembly.

Figure 2A:
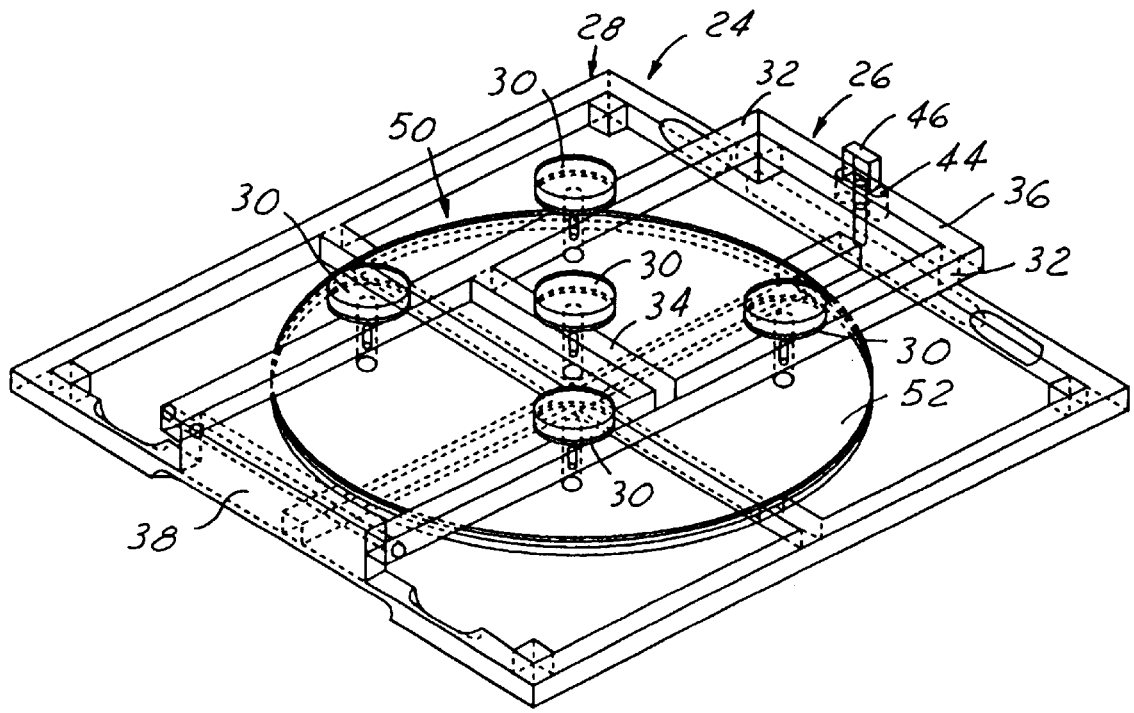
FIG. 2A is an exploded, perspective view of the present invention apparatus.

Referring now to FIG. 2A, wherein an exploded, perspective view of the present invention apparatus of transfer fixture and mold/substrate assembly is shown. The transfer fixture 24 is constructed of a lid member 26 and a base member 28. The same transfer fixture 24 is also shown in FIG. 2B in a plane view.

Figure 2B:
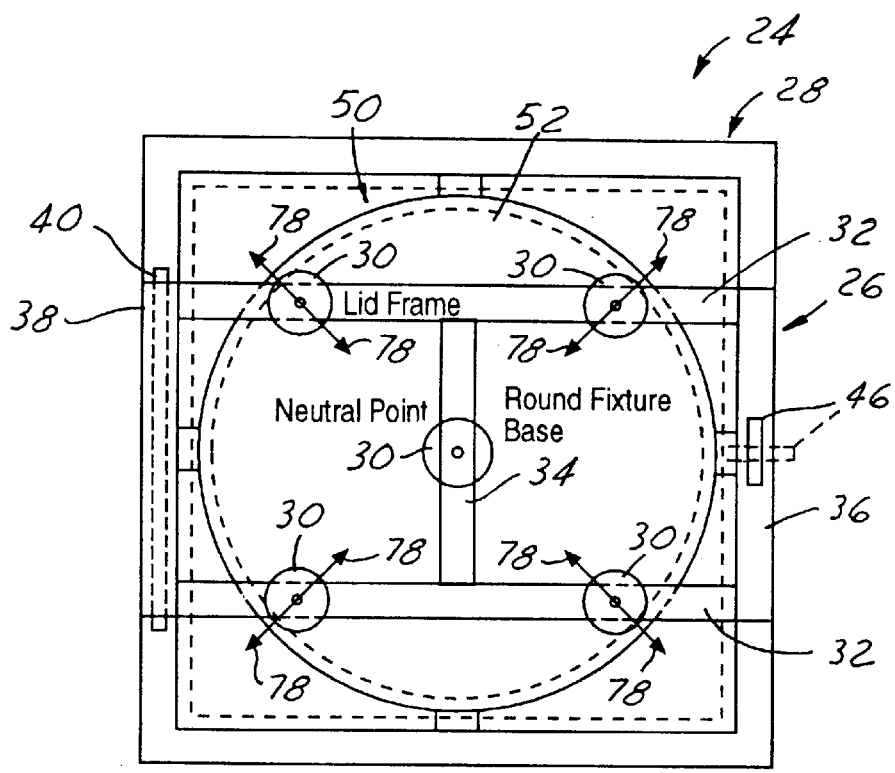
FIG. 2B is a plane view of the present invention apparatus.

As shown in FIGS. 2A and 2B, the lid member 26 is constructed in a H-frame configuration having two transverse members 32 and two cross members 34 and 36. The two transverse members 32 are connected by the cross member 36 at one end, while connected at the other end to a raised ridge 38 on the base member 28 by hinge 40. The lid member 26 and the base member 28 therefore operate in a clam-shell manner on hinge 40. On the cross member 36 of the lid member 26, an aperture 44 is provided to allow a latch 46 to penetrate therethrough. The latch member 46 can be turned by a quarter turn (as indicated by the ghost line shown in FIG. 2B) to lock the lid member 26 to the base member 28.

It should be noted that, while in FIGS. 2A and 2B a H-shaped lid member 26 is illustrated, lid member of any other shape as long as in a skeletal structure can be suitably used in the present invention apparatus. The key requirements are to provide mounting for the plurality of compression pins 30 and to allow a sufficient area of the mold/substrate assembly 50 to be exposed. This allows a uniform compression force to be placed on the top surface 52 of the mold/substrate assembly 50 and furthermore, to allow visual inspection of the mold/substrate assembly 50 after it is locked in the transfer fixture 24.

Figure 3A:
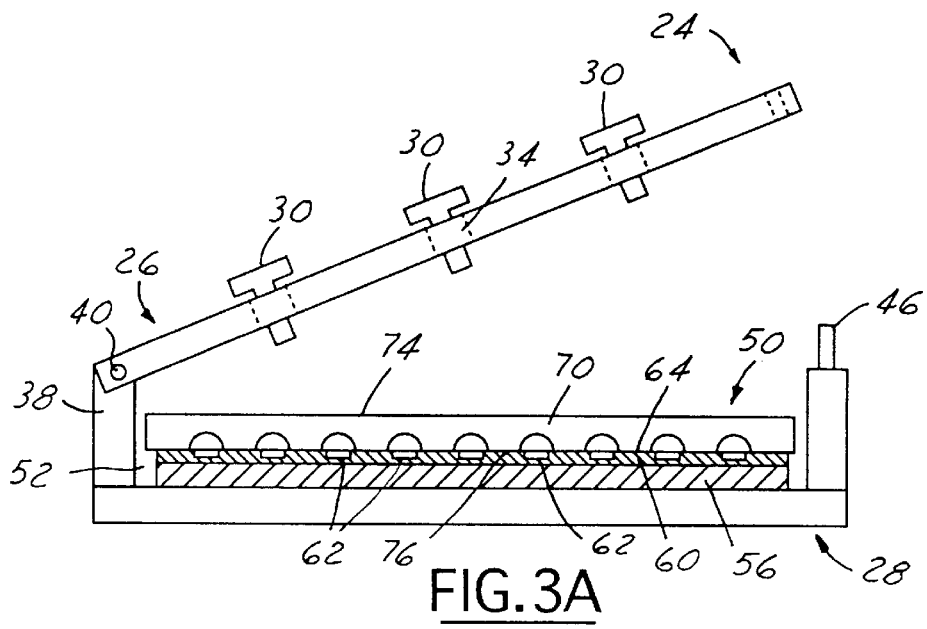
FIG. 3A is a cross-sectional view of the present invention apparatus having a mold/substrate assembly and a compressible member mounted therein.
Figure 3B:
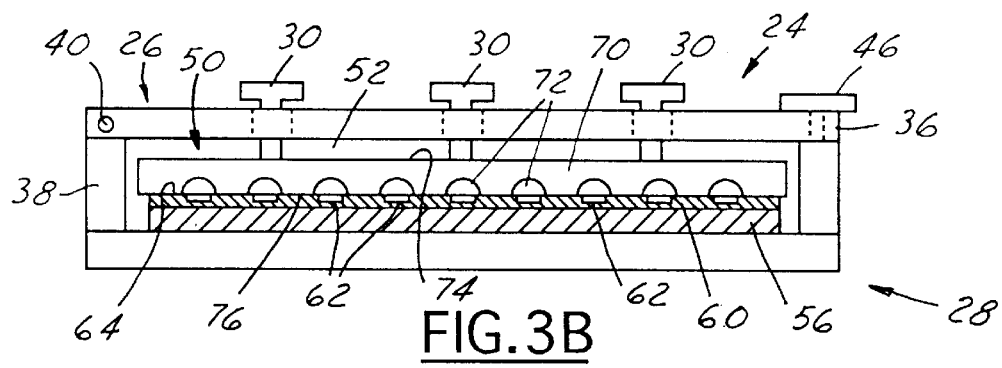
FIG. 3B is a cross-sectional view of the present invention apparatus of FIG. 3A with the lid member locked onto the base member.

The operation of the present invention novel apparatus, i.e., the transfer fixture 24 and the mold/substrate assembly 50, is shown in FIGS. 3A and 3B. Referring initially to FIG. 3A, wherein a cross-sectional view of the present invention novel apparatus is shown in an open position, i.e., lid member 26 is disengaged from the base member 28 exposing a cavity 52 therein. A high temperature foam such as a polyimide foam 56 is first placed inside the cavity 52 on top of the base member 28. A large sized silicon wafer 60 is then placed on the foam sheet 56 with solder-wettable bond pads 62 facing up. The wafer 60 either already have a thin coating of flux over its surface 64 that contains the bond pads 62, or can be coated while positioned on the foam sheet 56.

A mold 70 filled with solder 72 is then placed on wafer 60 with solder 72 facing the bond pads 62 on wafer 60. The positioning process assures proper alignment between the solder material 72 and the solder-wettable bond pads 62 on the wafer surface 64. Even though the placement of the solder mold 70 should ideally achieve the alignment function, it is possible to make final adjustments by moving the solder mold 70 in reference to the wafer 60. This can be readily accomplished by looking through the glass mold 70 to determine the alignment. The wafer 60 is normally kept in its position by stiction contact with the foam sheet 56.

After the final alignment process, lid member 26 of the transfer fixture 24 is closed which brings a plurality of compression pins 30 onto the back surface 74 of the solder mold 70. A final distance to completely close the lid member 26 begins to compress the foam sheet 56 under the wafer 60. The process produces a uniform joining force across the entire surface of the wafer 60 and assures abutting contact between the entire wafer and the mold interface 76. Since wafer 60 is normally thinner than the solder mold 70, wafer 60 is also more flexible and therefore can be treated as the compliant member.

The lid member 26 can be secured by latch 46, as shown in FIG. 3B, by turning the latch to a quarter turn. The alignment can be further confirmed before the assembly is placed in a reflow furnace. This is made possible by the present invention novel apparatus since the lid member 26 which has a simple H-frame structure permits visual examination of the mold/wafer assembly 50.

The transfer fixture 24 with the mold/substrate assembly 50 mounted therein is then placed into a reflow furnace. The temperature of the reflow furnace is brought up to a temperature above the solder reflow temperature. The furnace can be either a stationary or a moving belt-type furnace.

Another benefit made possible by the present invention novel transfer fixture is its capability of permitting a coefficient of thermal expansion (CTE) mismatch between a steel fixture and a glass mold/silicon wafer assembly. The solder mold 70 and the wafer 60 are CTE matched since the mold 70 is made of a borosilicate glass material which has substantially the same CTE of silicon. However, the mold/substrate assembly 50 is not matched to the CTE of the transfer fixture 24 which is normally made of steel. As a result, there is lateral motion between the transfer fixture 24 and the mold/substrate assembly 50. This must be accommodated while maintaining uniform vertical joining pressure on the mold/substrate assembly. The present invention novel apparatus accomplishes the task by a plurality of compression pins 30, e.g., five compression pins shown in FIGS. 2A and 2B, which are referenced thermally to the lid member of the steel transfer fixture 24 to allow the lid member to slide across the optically-smooth back 74 of the mold 70. The motion relative to the mold 70 is shown in FIG. 2B as diagonal arrows 78 at the four compression pins 30 positioned at an equal radius from the center compression pin 30. The center compression pin 30 is positioned at the center of the transfer fixture 24 and is therefore not effected by the CTE mismatch.

The present invention novel method is further made possible by the novel use of a compressible member, or the cellulosic foam sheet 56 which mechanically decouples the motion of the transfer fixture 24 from the mold/substrate assembly 50 during a subsequent heating cycle such as that occurring in a reflow furnace and the subsequent cooling. The lateral motion of the transfer fixture 24 relative to the mold/substrate assembly 50 is further achieved by having only point contacts on the compression pins 30 as previously described. The point contacts provided on the compression pins 30 enable a total contact area between CTE mismatched components in the transfer assembly of only a few $mm^2$.

At the other interface between the CTE mismatch components, i.e, between the bottom of the silicon wafer 60 and the high temperature foam sheet 56, the compliant nature of the foam sheet 56 easily compensates for the differences in lateral motion. Simultaneously, a uniform joining pressure is maintained due to the foam sheet 56 being vertically compressed as shown in FIG. 3B.

The present invention novel method and apparatus has therefore been amply described and demonstrated in the above descriptions and the appended drawings of FIGS. 1–3B. A further advantage achieved by the present invention novel method is that inspection of the filled mold assures 100% yield for the present invention bonding method. Unlike other processes which apply a solder material to a wafer directly by evaporation, plating or solder paste screening, the present invention novel method applies solder indirectly. While direct processes reqdefect, the present invention indirect process eliminates such possibility. When a fill defect is detected after a mold fill, the mold can be readily reworked by simply re-scanning the mold with a MSS head. However, the wafer itself is never subjected to the rework. Only perfectly filled molds are aligned and joined to the wafers, thus assuring 100% bumping yields.

Figure 4:
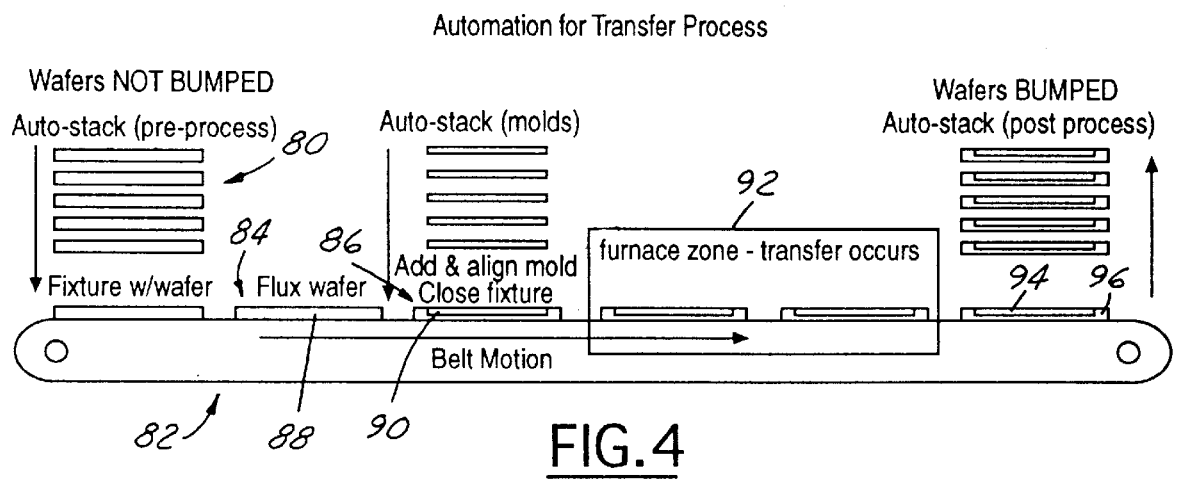
FIG. 4 is a side view of an automated solder transfer process.

Referring now to FIG. 4 wherein an automated process for carrying out the present invention method is shown. In this automated process, a stack of transfer fixtures 80 each containing an unbumped wafer mounted on a foam layer. As each fixture is released onto a moving conveyor belt 82, the wafer is fluxed at station 84. Thereafter, the fixture containing the fluxed wafer 88 passes station 86 which aligns and joins a solder-filled mold 90 to wafer 88 and subsequently, closes the fixture lid and thus applying joining pressure. The joined assembly then enters furnace 92 where reflow of the solder in the cavities occurs. The process metallurgically joins the solder to the solder-wettable bond pads on the wafer 88. After emerging from the furnace 92 and cooled, the fixtures are finally disassembled by opening the lid and removing the empty mold 94 from the bumped wafer 96.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. An apparatus for transferring solder bumps from a solder mold to a solder-receiving substrate comprising:

a transfer fixture comprises a lid member and a base member, a mold/substrate assembly comprises a solder mold and a solder-receiving substrate intimately joined together and positioned in said transfer fixture, first means for applying pressure on said mold/substrate assembly and allowing lateral motion between said lid member and said mold/substrate assembly, and second means for applying pressure on said mold/substrate assembly and allowing lateral motion between said base member and said mold/substrate assembly.

2. An apparatus for transferring solder bumps from a solder mold to a solder-receiving substrate according to claim 1, wherein said lid member being pivotally connected to said base member forming a clam-shell construction.

3. An apparatus for transferring solder bumps from a solder mold to a solder-receiving substrate according to claim 1, wherein said mold member being constructed of a material that is substantially transparent.

4. An apparatus for transferring solder bumps from a solder mold to a solder-receiving substrate according to claim 1, wherein said solder mold and said solder-receiving substrate have substantially the same coefficient of thermal expansion.

5. An apparatus for transferring solder bumps from a solder mold to a solder-receiving substrate according to claim 1, wherein said second means for applying pressure on said mold/substrate assembly and allowing lateral motion between said base member and said mold/substrate assembly comprises a compressible member adapted for placement between said base member and said mold/substrate assembly.

6. An apparatus for transferring solder bumps from a solder mold to a solder-receiving substrate according to claim 5, wherein said compressible member having a cellulosic structure for use at service temperatures up to 400° C.

7. An apparatus for transferring solder bumps from a solder mold to a solder-receiving substrate according to claim 1, wherein said first means for applying pressure and allowing lateral motion between said lid member and said mold/substrate assembly comprises a plurality of compression pins mounted through said lid member and adapted for applying a substantially uniform pressure on said mold/substrate assembly while allowing lateral motion between said lid member and said mold/substrate assembly.

8. An apparatus for transferring solder bumps from a solder mold to a solder-receiving substrate according to claim 7, wherein each of said plurality of compression pins being equipped with a point contact for contacting a top surface of said mold/substrate assembly.

9. An apparatus for transferring solder bumps from a solder mold to a solder-receiving substrate according to claim 7, wherein said plurality of compression pins is 5 compression pins spaced apart and positioned through said lid member having a H-shaped frame structure.

10. A method for transferring solder bumps from a mold to a substrate comprising the steps of:

providing a base member having a cavity formed therein, positioning a compressible member in said cavity, positioning a mold/substrate assembly on top of said compressible member, and compressing a top surface of said mold/substrate assembly by a lid member.

11. A method for transferring solder bumps from a mold to a substrate according to claim 10 further comprising the step of providing a plurality of compression pins in said lid member and adjusting toward or away from a top surface of said mold/substrate assembly such that a uniform pressure is applied on said top surface.

12. A method for transferring solder bumps from a mold to a substrate according to claim 10, wherein said solder bumps are transferred from a solder mold to a solder-receiving substrate.

13. A method for transferring solder bumps from a mold to a substrate according to claim 10 further comprising the step of pivotally connecting said lid member to said base member and forming a clam-shell construction.

14. A method for transferring solder bumps from a mold to a substrate according to claim 10 further comprising the step of providing a lid member having a skeletal structure such that said mold/substrate assembly is substantially exposed.

15. A method for transferring solder bumps from a mold to a substrate according to claim 10 further comprising the step of aligning bond pads on said substrate with cavities in said mold prior to the compression step.

16. A method for transferring solder bumps from a mold to a substrate according to claim 10 further comprising the step of providing a compressible member having a cellulosic structure.

17. A method for transferring solder bumps from a mold to a substrate according to claim 10 further comprising the step of providing a mold constructed of a material that is substantially transparent.

18. A method for transferring solder bumps from a mold to a substrate according to claim 10 further comprising the step of providing a mold and a substrate that have substantially the same coefficient of thermal expansion.

19. A method for transferring solder bumps from a mold to a substrate according to claim 10 further comprising the step of mechanically decoupling said compressible member from said mold/substrate assembly such that said base member may move independently from said mold/substrate assembly for accommodating mismatch in coefficient of thermal expansion during a subsequent thermal cycle.

20. A method for transferring solder bumps from a mold to a substrate according to claim 10 further comprising the step of reflowing and transferring solder in said mold to said substrate in a reflow furnace.

21. A method for transferring solder bumps from a mold to a substrate according to claim 10 further comprising the step of removing an empty mold from a bumped substrate.

22. A method for transferring solder bumps from a mold to a substrate according to claim 10 further comprising the step of contacting a top surface of said mold/substrate assembly with point contacts provided on the tip of a plurality of compression pins positioned in the lid member and applying a uniform pressure.

23. A method for transferring solder bumps from a mold to a substrate according to claim 22 further comprising the step of mechanically decoupling said plurality of compression pins from said mold/substrate assembly such that either the lid member or the mold/substrate assembly may move independent of the other to accommodate mismatch in coefficient of thermal expansion during a subsequent thermal cycle.

24. An apparatus for transferring solder bumps from a mold to a substrate comprising:

a base member adapted for receiving a mold/substrate assembly therein, a compressible member adapted for placement between said base member and said mold/substrate assembly, and a lid member adapted for engaging said base member in such a way that a substantially uniform pressure is applied on top of said mold/substrate assembly.

25. An apparatus for transferring solder bumps according to claim 24, wherein said base member comprises a base plate and two side plates each joined to said base plate at an opposite end.

26. An apparatus for transferring solder bumps according to claim 24, wherein said lid member being pivotally connected to said base member in a clam-shell construction.

27. An apparatus for transferring solder bumps according to claim 24, wherein said lid member having a skeletal structure such that said mold/substrate assembly being substantially exposed.

28. An apparatus for transferring solder bumps according to claim 24, wherein said lid member is a H frame such that the mold/substrate assembly under the lid member can be readily examined.

29. An apparatus for transferring solder bumps according to claim 24, wherein said compressible member having a cellulosic structure which can be uniformly compressed.

30. An apparatus for transferring solder bumps according to claim 24, wherein said compressible member having a foam structure for surviving a temperature exposure up to 400° C.

31. An apparatus for transferring solder bumps according to claim 24, wherein said compressible member applies a uniform joining force across the entire surface of the substrate and assures abutting contact between the entire substrate and the mold surface.

32. An apparatus for transferring solder bumps according to claim 24, wherein said compressible member enables said base member to mechanically decouple from said mold/substrate assembly so as to allow independent movement of said base member against said mold/substrate assembly to accommodate mismatch in coefficient of thermal expansion during a subsequent thermal cycle.

33. An apparatus for transferring solder bumps according to claim 24, wherein said mold/substrate assembly comprises a solder mold and a solder-receiving substrate intimately joined together.

34. An apparatus for transferring solder bumps according to claim 33, wherein said solder mold being constructed of a material that is substantially transparent.

35. An apparatus for transferring solder bumps according to claim 33, wherein said solder mold being constructed of a glass material that is substantially clear.

36. An apparatus for transferring solder bumps according to claim 33, wherein said solder mold and said solder-receiving substrate having substantially the same coefficient of thermal expansion.

37. An apparatus for transferring solder bumps according to claim 24, wherein said lid member further comprises a plurality of compression pins adapted for applying said substantial uniform pressure on top of said mold/substrate assembly.

38. An apparatus for transferring solder bumps according to claim 37, wherein each of said plurality of compression pins being equipped with a point contact for contacting a top surface of said mold/substrate assembly.

39. An apparatus for transferring solder bumps according to claim 37, wherein each of said plurality of compression pins being independently adjustable toward or away from said mold/substrate assembly.

40. An apparatus for transferring solder bumps according to claim 37, wherein said plurality of compression pins enable said lid member to mechanically decouple from said mold/substrate assembly so as to allow independent movement of said lid member relative to said assembly to accommodate mismatch in coefficient of thermal expansion during a subsequent thermal cycle.

41. An apparatus for transferring solder bumps according to claim 37, wherein said plurality of compression pins are five compression pins positioned spaced apart through said lid member for applying a substantial uniform pressure on top of the mold/substrate assembly.

* * * * *